United States Patent
Pividori

(10) Patent No.: US 6,586,313 B2
(45) Date of Patent: Jul. 1, 2003

(54) METHOD OF AVOIDING THE EFFECTS OF LACK OF UNIFORMITY IN TRENCH ISOLATED INTEGRATED CIRCUITS

(75) Inventor: Luca Pividori, Curno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/997,227

(22) Filed: Nov. 29, 2001

(65) Prior Publication Data

US 2003/0100166 A1 May 29, 2003

(51) Int. Cl.[7] ............................................... H01L 21/76
(52) U.S. Cl. ........................................................ 438/424
(58) Field of Search ................................. 438/296, 424, 438/427, 435

(56) References Cited

U.S. PATENT DOCUMENTS

| | | | | |
|---|---|---|---|---|
| 4,665,007 A | * | 5/1987 | Cservak et al. | 438/424 |
| 5,817,568 A | * | 10/1998 | Chao | 438/427 |
| 5,960,299 A | * | 9/1999 | Yew et al. | 438/424 |
| 5,966,614 A | * | 10/1999 | Park et al. | 438/401 |
| 5,998,278 A | * | 12/1999 | Yu | 438/424 |
| 6,004,863 A | * | 12/1999 | Jang | 438/427 |
| 6,071,792 A | * | 6/2000 | Kim et al. | 438/424 |
| 6,228,727 B1 | * | 5/2001 | Lim et al. | 438/296 |
| 6,238,997 B1 | * | 5/2001 | Chen et al. | 438/400 |
| 6,261,966 B1 | * | 7/2001 | Li et al. | 438/706 |

* cited by examiner

Primary Examiner—Carl Whitehead, Jr.
Assistant Examiner—David S Blum
(74) Attorney, Agent, or Firm—Lisa K. Jorgenson; Dennis M. de Guzman; Seed IP Law Group PLLC

(57) ABSTRACT

Method for fabricating integrated circuits comprising non-volatile memory cell matrices and peripheral circuits, said method comprising the steps of preparing a silicon substrate, carrying out a shallow trench isolation process on the silicon substrate to form active areas of exposed silicon isolated from one another by trenches filled with field oxide, growing a thin oxide layer on the active areas, masking the substrate areas intended for the memory cell matrices and etching the thin oxide layer and the field oxide by a chemical etch for a time longer than the time needed for removing the thin oxide layer entirely from the substrate areas intended for the peripheral circuits.

11 Claims, 2 Drawing Sheets

METHOD OF AVOIDING THE EFFECTS OF LACK OF UNIFORMITY IN TRENCH ISOLATED INTEGRATED CIRCUITS

BACKGROUND OF THE INVENTION

1. Field of the invention

The present invention relates to a method for fabricating integrated circuits (IC) comprising non-volatile memory cell matrices and peripheral circuits.

2. Description of the Related Art

A well-known method for device isolation in an IC is the so-called Local Oxidation of Silicon (LOCOS) technique. According to this technique inserts of silicon dioxide (field oxide) are formed in a silicon substrate to provide electrical isolation between components of the IC. As integration becomes higher, this technique can hardly be used because of certain inherent limitations of the resulting isolation structure, such as the so called "bird's beak" formation.

In sub-half micron semiconductor fabrication is now widely used another isolation technique, known as Shallow Trench Isolation (STI).

A conventional method for fabricating an STI structure is described in the following with reference to FIGS. 1A–1F, which show sectional views of a portion of a silicon wafer in the initial steps of the fabrication of an IC.

Referring first to FIG. 1A, a silicon substrate 10 is prepared and thermally oxidized to grow a layer 11 of silicon dioxide. Next, a layer 12 of silicon nitride is formed over the oxide layer 11, a photoresist layer 13 is laid on the nitride layer 12 and selectively removed to serve as an etching mask. Then, an anisotropic etching is performed to remove the unmasked portions of the nitride layer 12 with the underlying oxide 11 and to etch the substrate 10 until a predetermined depth (typically 270–300 nm), to form a plurality of trenches 14. After this, the rest of the photoresist layer 13 is removed.

Referring next to FIG. 1B, silicon dioxide is deposited, for example by an atmospheric-pressure chemical vapor deposition (APCVD) process, into the trenches 14 and over the silicon nitride layer 12 to form a silicon dioxide layer 16. The oxide layer 16 is then densified by heating the wafer at a temperature of about 1,000° C. for 10 to 30 minutes. Usually, before the APCVD step a thermal oxidation is performed to grow a thin layer of silicon dioxide on the surfaces of the trenches 14. To simplify the drawing this thin layer is not shown in the figures.

Referring to FIG. 1C, a Chemical-Mechanical Polishing (CMP) is performed to remove the upper portion of the oxide layer 16 using the nitride layer 12 as a stop layer. The portions of oxide layers 16 lying in the trenches 14, usually referred to as "plugs", are indicated by the same reference numeral 16.

Referring to FIG. 1D the nitride layer 12 and the oxide layer 11 are removed by using suitable etchants. During the step for removing the oxide layer 11, the plugs 16 are also etched and are leveled substantially to the top surface of the substrate 10. The resulting STI structure is formed as shown with recesses 17 in the oxide near the edges of the trenches. This is because the etching solution, usually HF, used to remove the oxide layer 11 etches the plug oxide, which is deposited silicon dioxide, more rapidly than the thermal silicon dioxide of layer 11 and because the plug oxide extends to a level higher than the level of oxide layer 11.

At this stage, different process steps are required to form a matrix of cells for the non-volatile memory, such as a flash memory, and peripheral circuits, i.e. circuits for driving the memory and other circuits, such as logic processing circuits. First, layers of different materials required for the memory matrix are successively formed on the entire substrate, then the substrate areas intended for the matrix are covered by a mask and the portions of these layers not covered by the mask and intended for the peripheral circuits are entirely removed to enable subsequent steps for the formation of components of the peripheral circuits. In particular, as shown in FIG. 1E, where a section of a substrate portion intended for the peripheral circuits is shown, a "tunnel" oxide layer 20, i.e. a thin oxide layer, to be used for the "tunnel" dielectric in the memory cells, is grown by thermal oxidation of the silicon substrate 10. Typically, the tunnel oxide has a thickness of 10–11 nm. Then a "floating gate" polysilicon layer or poly-1 layer 21, i.e. a layer of doped polysilicon to be used for the floating gates of the memory cells, is deposited over the "tunnel" oxide layer 20. Next, an "interpoly" oxide layer 22, i.e. a dielectric layer, or several superimposed layers, usually silicon Oxide, silicon Nitride and silicon Oxide (ONO), to be used for insulating the floating gates of the matrix cells from the control gates obtained from another polysilicon layer to be formed in a following step, is deposited over the poly-1 layer 21. A photoresist layer 23 is deposited and selectively removed to serve as a mask for protecting the areas, not shown, intended for the memory matrix. The portions of layers 22, 21 and 20 overlying the areas intended for the peripheral circuits are then removed. In particular, the interpoly dielectric layer 22 and the poly-1 layer 21 are removed by a dry etching step and the tunnel oxide layer 21 is removed by using a Buffered Oxide Etching (BOE) solution. The time for the wet BOE etching step is determined in accordance with the thickness of the tunnel oxide layer 20.

The photoresist mask is then entirely removed and the usual steps for forming the memory cells and the components of the peripheral circuits are performed, in particular depositing a doped polysilicon layer, or poly-2, intended for forming the control gates of the memory cells, defining the matrix array by a self-aligned etching, forming source and drain regions for the memory cells— and transistors of the peripheral circuits, removing the exposed tunnel oxide (optional), defining poly-2 pattern for interconnections in the peripheral circuits, etching oxide for a Self-Aligned Source (SAS) formation, reoxidation for sealing the memory matrix, defining spacers, "pre-metal" deposition, contact opening and metal deposition and definition.

Wafers processed according to the method described above have a relatively low yield because of a high concentration of defective devices in the border zones of the wafer.

BRIEF SUMMARY OF THE INVENTION

In view of the state of the art described, an embodiment of the present invention provides a method which is able to increase the production yield.

The invention is based on the hypothesis that the observed concentration of defective devices in the border zones of the wafer is directly related with the CMP steps. More particularly, it is supposed that the recesses formed in the isolation plugs near the edges of the trenches, as indicated at 17 in FIG. 1D, may remain filled with doped polysilicon deposited in process steps following the STI process, thus causing short-circuits between adjacent components. It is also supposed that this problem affects more the peripheral circuits, where the active areas have different sizes, than the memory matrix, where the active areas have all the same size.

The improved method applies to the fabrication of integrated circuits comprising non-volatile memory devices and peripheral circuits.

A preferred embodiment of this method comprises the steps of preparing a silicon substrate, carrying out a shallow trench isolation (STI) process on the silicon substrate to obtain active areas of exposed silicon isolated from one another by trenches filled with field oxide, growing a thin oxide layer on the active areas, depositing a first layer of a conductive material, depositing a second layer of an insulating material, masking the substrate areas intended for the memory cell matrices, removing the insulating material of said second layer and the conductive material of said first layer from the unmasked areas to expose the thin oxide layer and the field oxide of the substrate areas intended for the peripheral circuits and etching the thin oxide layer and the field oxide by a chemical etch for a time longer than the time needed for removing the thin oxide layer entirely from the substrate areas intended for the peripheral circuits.

BRIEF DESCRIPTION OF THE SEVERAL VIEWS OF THE DRAWINGS

The invention can be more fully understood by reading the following detailed description of a preferred embodiment, with reference to the accompanying drawings, wherein.

DETAILED DESCRIPTION OF THE INVENTION

Figure 1A:
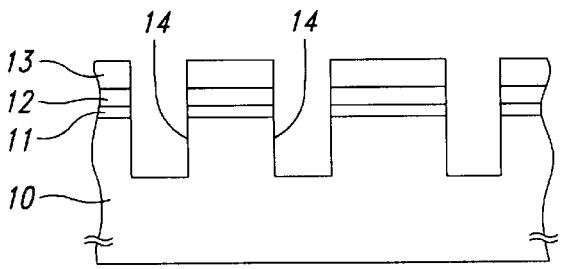
FIGS. 1A–1F are schematic sectional views used to depict the main steps of a conventional method for fabricating an STI structure and FIGS. 2A–2F are schematic sectional views used to depict the characteristic steps of the method of the invention.
Figure 1B:
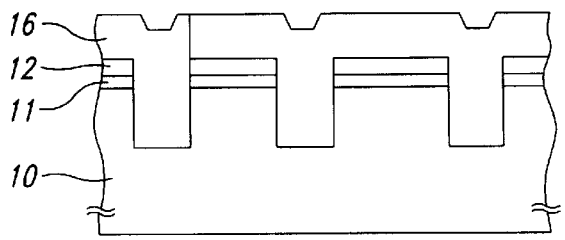

A method according to the invention is described in part with reference to FIGS. 1A–1F, because most of the process steps are the same as the conventional process steps, and in part with reference to FIGS. 2A–2F, wherein the same reference numerals as in FIGS. 1A–1F indicate the same or equivalent elements.

Figure 1C:
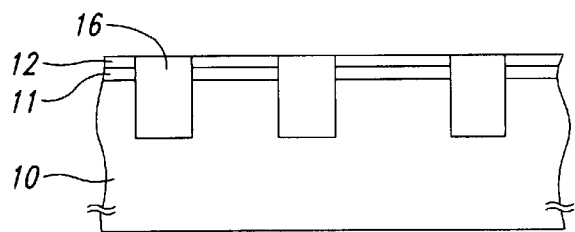
Figure 1D:
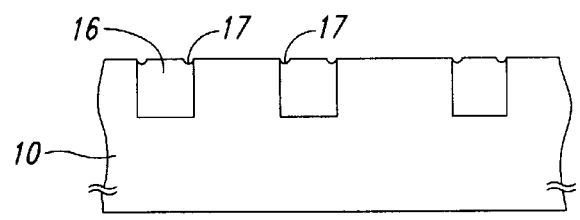
Figure 2A:
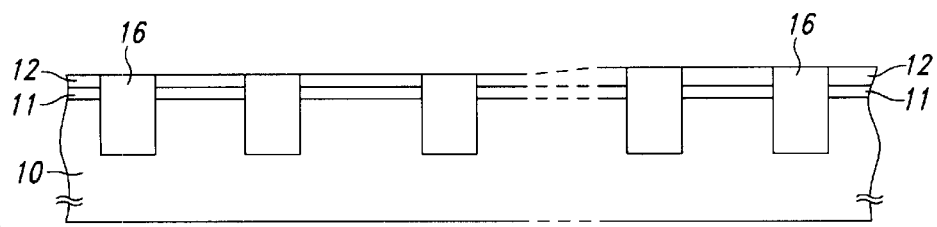

After a CMP step as described in connection with FIG. 1C is carried out, sections of the substrate 10 taken at different locations of the wafer and representing corresponding portions of similar IC devices, may differ from one another as shown in FIG. 2A. The left-hand portion of FIG. 2A, which is similar to FIG. 1C, represents a section of an IC device in a central area of the wafer and the right-hand portion of FIG. 2A represents a section of an IC device in a border area of the wafer. Because of small non-uniformities of the planarization apparatus used in the CMP operation, the central area is polished more deeply than the border area. Therefore, the isolation structure in the border area has a residual nitride layer 12 and a level of residual isolation oxide 16 higher than the isolation structure in the central area.

Figure 2B:
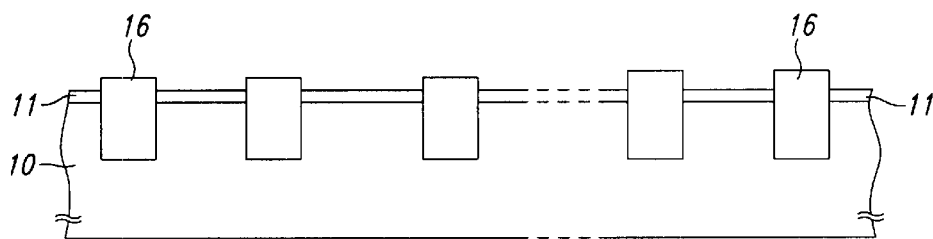
Figure 2C:
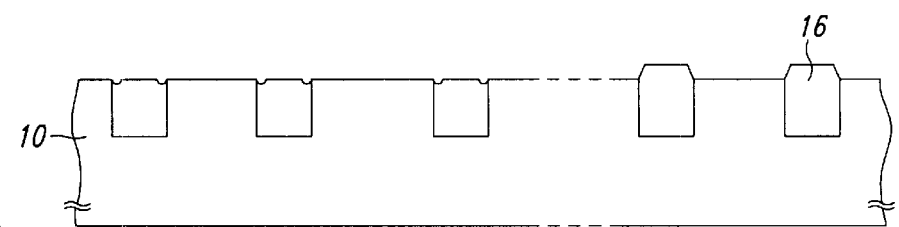

Removal of the nitride layer 12 by etching as explained in connection with FIG. 1C results in the structure as shown in FIG. 2B, where the oxide-plugs 16 in the border area project to a higher level than the oxide plugs in the central area. The following oxide etching step as shown in FIG. 2C, results in oxide plugs 16 in the central area substantially flush with the adjacent active areas and in oxide plugs 16 in the border area projecting from the adjacent active areas.

Figure 1E:
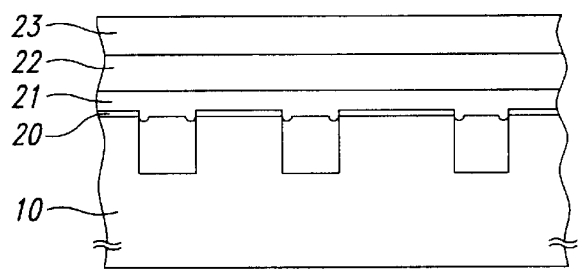
Figure 1F:
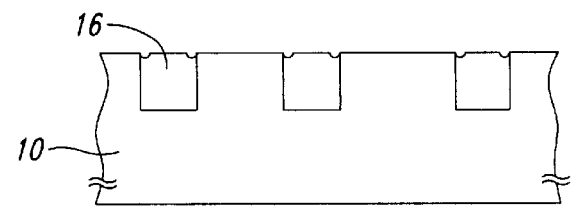
Figure 2D:
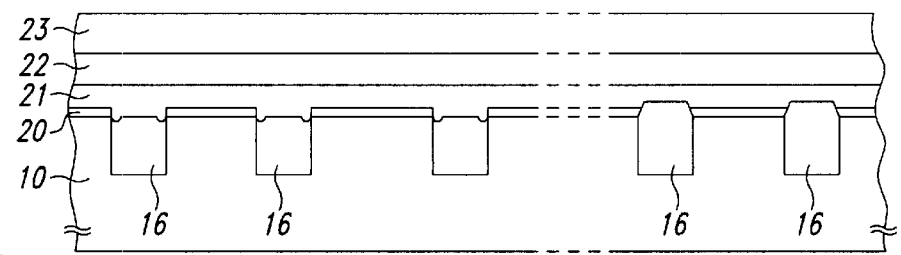
Figure 2E:
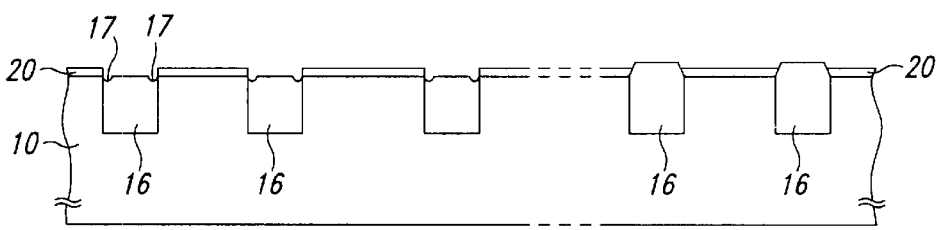

The subsequent steps of forming the layers required for the formation of the memory cells (tunnel oxide, poly-1, interpoly and photoresist) result in the structures as shown in FIGS. 2D, which are similar to the structures shown in FIG. 1E, except for a higher level of plug oxide in the border area. Also the next steps of removing the interpoly layer 22 and the poly-1 layer 21 by dry etching are the same as the corresponding steps explained in connection with the prior art method. The resulting structures are shown in FIG. 2E. The isolation plugs 16 in the border area project to a level higher than the tunnel oxide layer 20.

Figure 2F:
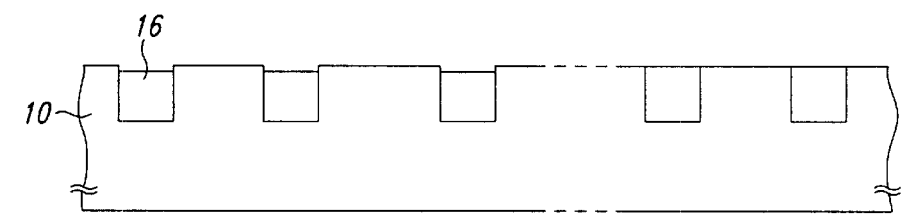

According to an embodiment of the invention, the subsequent step is a wet etching by using a Buffered Oxide Etching (BOE) solution, as in the prior art method, but for a time substantially longer than the time necessary for removing the tunnel oxide. The time of this etching step is determined to be long enough to remove plug oxide from the structures where the level of the plug oxide is higher than the adjacent active areas to a level equal to or lower than the level of the adjacent active areas. The resulting structures are shown in FIG. 2F. In a structure with trenches having a depth of 270 nm to 300 nm and a tunnel oxide layer having a thickness of 10 nm to 11 nm the etching time is preferably determined to be long enough to remove 40 nm to 70 nm of thermal silicon dioxide. It is supposed that this longer etching step eliminates any filaments of conductive polysilicon which may have remained on the recesses 17 of the exposed surfaces of the plugs 16 and any further surface impurities. It is also assumed that the etching step is beneficial for relieving any stresses in the plug oxide, thus improving isolation.

It should be noted that this overetching is carried out in contrast with the accepted general rule which recommends that a chemical etch for removing a layer of material should last not more than the time which is strictly necessary to remove the layer, to avoid any undesirable associated effect. In this case, however, it has been proven that the overetching not only did not cause any negative effect, but also that it was highly positive to improve the production yield.

Having thus described one illustrative embodiment of the invention, various alterations, modifications, and improvement will readily occur to those skilled in the art. Such alterations, modifications and improvements are intended to be within the spirit and scope of the invention which is limited only as defined in the following claims and the equivalent thereto.

What is claimed is:

1. A method for fabricating integrated circuits including non-volatile memory cell matrices and peripheral circuits, said method comprising the steps of:

preparing a silicon substrate;

carrying out a shallow trench isolation process on the silicon substrate to form active areas of exposed silicon isolated from one another by trenches filled with field oxide, the filled trenches having top surfaces with recesses formed in the field oxide;

growing a thin silicon oxide layer on the active areas;

masking substrate areas intended for the memory cell matrices; and etching the thin silicon oxide layer and the field oxide by a chemical etch for a time longer than a time needed for removing the thin silicon oxide layer entirely from the substrate areas intended for the peripheral circuits, to remove the recesses.

2. The method according to claim 1, wherein the thin silicon oxide layer is grown to a thickness of 10 nm to 11 nm and the time of the chemical etching is determined to be long enough to remove 40 nm to 70 nm of silicon oxide.

3. A method for fabricating integrated circuits comprising non-volatile memory cell matrices and peripheral circuits, said method comprising the steps of:

preparing a silicon substrate;

carrying out a shallow trench isolation process on the silicon substrate to obtain active areas of exposed silicon isolated from one another by trenches filled with field oxide, the filled trenches having top surfaces with recesses formed in the field oxide;

growing a thin silicon oxide layer on the active areas;

depositing a first layer of a conductive material;

depositing a second layer of an insulating material;

masking substrate areas intended for the memory cell matrices;

removing the insulating material of said second layer and the conductive material of said first layer from unmasked areas to expose the thin silicon oxide layer and the field oxide of the substrate areas intended for the peripheral circuits; and etching the thin silicon oxide layer and the field oxide by a chemical etch for a time longer than a time needed for removing the thin silicon oxide layer entirely from the substrate areas intended for the peripheral circuits, to remove the recesses.

4. The method according to claim 3, wherein the thin silicon oxide layer is grown to a thickness of 10 nm to 11 nm and the time of the chemical etching is determined to be long enough to remove 40 nm to 70 nm of silicon oxide.

5. The method according to claim 3, wherein the step of depositing a first layer of a conductive material includes depositing and doping a layer of polysilicon.

6. The method according to claim 3, wherein the step of depositing a second layer of an insulating material includes depositing successively silicon oxide, silicon nitride and silicon oxide.

7. A method for fabricating integrated circuits including non-volatile memory cell matrices and peripheral circuits, said method comprising:

carrying out a shallow trench isolation process on a silicon substrate to form active areas of exposed silicon isolated from one another by oxide plugs formed by trenches filled with field oxide, the oxide plugs having top surfaces with recesses formed in field oxide;

growing a first thin dielectric layer on the active areas;

masking substrate areas intended for the memory cell matrices; and overetching the thin dielectric layer and the field oxide by a chemical etch that removes the thin dielectric layer from substrate areas intended for the peripheral circuits and etches enough of the oxide plugs to remove the recesses, to where a level of at least some of the oxide plugs is lower than a level of adjacent active areas.

8. The method of claim 7 wherein the thin dielectric layer is a silicon oxide layer that is grown to a thickness of 10 nm to 11 nm and the chemical etch is carried out long enough to remove 40 nm to 70 nm of silicon oxide.

9. The method of claim 7, further comprising depositing a conductive layer on the thin dielectric layer, depositing an insulating layer on the conductive layer, and removing the conductive and insulating layers prior to etching the thin dielectric layer.

10. The method of claim 9 wherein depositing the conductive layer includes depositing and doping a layer of polysilicon.

11. The method of claim 9 wherein depositing the insulating layer includes depositing successively silicon oxide, silicon nitride and silicon oxide.

* * * * *